(12) United States Patent
Wohlfrom et al.

(10) Patent No.: US 10,667,441 B2
(45) Date of Patent: May 26, 2020

(54) ELECTRONIC UNIT

(71) Applicant: C. & E. Fein GmbH, Schwaebisch Gmuend-Bargau (DE)

(72) Inventors: Christoph Wohlfrom, Heubach (DE); Wolfgang Duernegger, Schorndorf (DE)

(73) Assignee: C&E Fein GmbH, Schwaebisch Gmuend-Bargau (DE)

( * ) Notice: Subject to any disclaimer, the term of this patent is extended or adjusted under 35 U.S.C. 154(b) by 0 days.

(21) Appl. No.: 16/404,194

(22) Filed: May 6, 2019

(65) Prior Publication Data

US 2019/0343016 A1    Nov. 7, 2019

(30) Foreign Application Priority Data

May 4, 2018   (DE) .......................... 10 2018 110 754

(51) Int. Cl.
| | | |
|---|---|---|
| H05K 7/20 | (2006.01) | |
| H05K 1/02 | (2006.01) | |
| H05K 1/18 | (2006.01) | |
| H05K 5/06 | (2006.01) | |
| H05K 7/14 | (2006.01) | |

(52) U.S. Cl.
CPC .......... *H05K 7/209* (2013.01); *H05K 1/0203* (2013.01); *H05K 1/181* (2013.01); *H05K 5/064* (2013.01); *H05K 7/1432* (2013.01); H05K 2201/066 (2013.01); H05K 2201/10409 (2013.01)

(58) Field of Classification Search
CPC ......... H05K 5/064; H05K 2201/10416; H05K 1/0203; H05K 1/181; H05K 7/1432; H05K 7/209; H05K 2201/066; H05K 2201/10409
See application file for complete search history.

(56) References Cited

U.S. PATENT DOCUMENTS

| | | | | |
|---|---|---|---|---|
| 4,573,103 A | * | 2/1986 | Nilsson | ................ H05K 1/0204 174/547 |
| 6,195,257 B1 | * | 2/2001 | Janicek | .................. H05K 3/366 165/185 |
| 6,266,244 B1 | * | 7/2001 | Guthrie | .................... H01L 23/40 165/80.3 |
| 6,324,059 B1 | * | 11/2001 | Werner | ............... H01L 23/4093 165/80.3 |
| 7,961,472 B2 | | 6/2011 | Tokuyama et al. | |

(Continued)

FOREIGN PATENT DOCUMENTS

| | | |
|---|---|---|
| DE | 7243031 U | 3/1973 |
| DE | 102006022497 A1 | 11/2007 |

(Continued)

*Primary Examiner* — Jacob R Crum
(74) *Attorney, Agent, or Firm* — Muncy, Geissler, Olds & Lowe, P.C.

(57) ABSTRACT

An electronic unit for a hand-held power tool, having a mounting frame having an accommodation space into which a circuit board carrying a plurality of electronic components is inserted and at least one heat sink for the heat dissipation of waste heat arising at the electronic components. A slot section with at least one insertion slot, oriented perpendicular to the printed circuit board, for mounting an electronic component along a direction of insertion is formed on the mounting frame. The at least one heat sink is associated with the slot section.

17 Claims, 4 Drawing Sheets

(56) References Cited

U.S. PATENT DOCUMENTS

| | | | |
|---|---|---|---|
| 8,081,472 B2 | 12/2011 | Tokuyama et al. | |
| 8,743,548 B2 | 6/2014 | Tokuyama et al. | |
| 9,307,666 B2 | 4/2016 | Tokuyama et al. | |
| 2010/0283332 A1* | 11/2010 | Toukairin | B25F 5/008 |
| | | | 310/50 |
| 2013/0092431 A1 | 4/2013 | Jones et al. | |
| 2013/0313925 A1* | 11/2013 | Mergener | B25F 5/00 |
| | | | 310/50 |
| 2013/0328460 A1* | 12/2013 | Kamiya | H02K 11/024 |
| | | | 310/68 R |
| 2014/0233204 A1 | 8/2014 | Tokuyama et al. | |
| 2014/0361645 A1* | 12/2014 | Beyerl | H02K 7/145 |
| | | | 310/50 |
| 2016/0295740 A1 | 10/2016 | Shibata | |
| 2017/0013740 A1* | 1/2017 | Mergener | H05K 1/181 |
| 2017/0295662 A1 | 10/2017 | Sakai | |
| 2018/0343775 A1 | 11/2018 | Huang et al. | |

FOREIGN PATENT DOCUMENTS

| | | |
|---|---|---|
| DE | 112015004622 T5 | 6/2017 |
| EP | 2288012 A1 | 2/2011 |
| EP | 3407692 A1 | 11/2018 |
| WO | WO2017173000 A1 | 10/2017 |

* cited by examiner

ELECTRONIC UNIT

This nonprovisional application claims priority under 35 U.S.C. § 119(a) to German Patent Application No. 10 2018 110 754.4, which was filed in Germany on May 4, 2018, and which is herein incorporated by reference.

BACKGROUND OF THE INVENTION

Field of the Invention

The present invention relates to an electronic unit for a hand-held power tool, comprising a mounting frame, having an accommodation space into which a circuit board, carrying a plurality of electronic components, is inserted and at least one heat sink for the heat dissipation of waste heat arising at the electronic components.

Description of the Background Art

An electronic unit of this kind is known, for example, from WO 2017/173000 A1, in which the electronic components are soldered on the circuit board. During assembly, the electronic components must first be individually placed on the circuit board before they can be soldered to the circuit board. This is associated with a relatively high assembly effort, which adversely affects the production time and thus also the manufacturing cost of the electronic unit. In addition, the heat sinks used in WO 2017/173000 A1, which are provided for the heat dissipation of the arising waste heat, have mounting portions which are mounted perpendicular to the circuit board, whereas the actual heat sinks do not directly contact the electronic components. This has the further disadvantage that as a result there is only limited cooling of the electronic components.

SUMMARY OF THE INVENTION

It is therefore an object of the present invention to reduce the above-mentioned disadvantages and to provide an electronic unit for a hand-held power tool that ensures easy assembly and improved cooling.

In an exemplary embodiment an electronic unit is provided in that a slot section, with at least one insertion slot, oriented perpendicular to the circuit board, for mounting an electronic component along a direction of insertion is formed on the mounting frame, and in that the at least one heat sink is associated with the slot section.

As a result, the assembly of the electronic unit is significantly simplified. Thus, electronic components that are either difficult to attach or generate much waste heat or are particularly sensitive to temperature, especially MOSFETs, are first inserted into the insertion slots, which are formed in the slot section of the mounting frame. In a next step, the circuit board, which can be equipped with further electronic components, is then inserted into the accommodation space. In this case, it is provided in the context of the invention that the terminal contacts, which are formed on the electronic components mounted in the insertion slots, are here passed through holes which are formed in the circuit board. The electronic components mounted in the insertion slots can then be connected thermally to the at least one heat sink by suitable coupling elements, such as, for example, thermal paste, heat conducting pads, or heat conduction tapes, and securely connected thereto, for example, by means of a screw and/or riveted connection. It is then possible to fasten the electronic components mounted in the insertion slots, for example, by means of a soldered connection on the circuit board side facing away from the slot section. The fastening of the electronic components to the heat sink before the actual soldering of the electronic components to the circuit board has the advantage that their position is fixed within the insertion slots and relative to the employed circuit board. As a result, additional lateral forces and stresses on the electronic components and on the solder joint are avoided. This has the effect that the solder joint itself is free of additional mechanical stresses, as a result of which the mechanical stress on the electronic components can also be ultimately reduced and thereby the life of the electronic components can be extended. Finally, the assignment of the at least one heat sink to the slot section also ensures that the waste heat of the electronic components mounted in the insertion slots is dissipated particularly effectively, because this increases the contact area between the heat sinks and the electronic components mounted in the at least one insertion slot. The slot section can be formed here either as a separate part or particularly preferably integrally with the mounting frame.

In order to further improve the cooling performance of the electronic unit of the invention, a plurality of heat sinks can be provided, which are disposed on opposite end faces of the slot section. As a result, the heat sinks are in direct contact with the electronic components to be cooled, which are mounted in the insertion slots. In addition, these electronic components are also protected by the heat sinks, disposed on both sides on the slot section, against mechanical influences, contamination from the working environment of the hand-held power tool, and thus ultimately from damage. In order to ensure an improved heat transfer hereby, it also proved to be beneficial when a heat conducting pad is placed between the electronic components, mounted in the insertion slots, and the heat sinks.

An electronic unit design as compact as possible is achieved in that the at least one insertion slot is provided multiple times, and when the insertion slots are arranged in a first row and in a second row, which are spaced from one another by a separator. The separator prevents the electronic components located in the first row and in the second row from touching in an undesired manner.

It has also proven to be beneficial if coupling structures, which interact with counter-structures formed on the at least one heat sink, are formed on the slot section. As a result, the heat sinks can be easily connected to the slot section, which has a positive effect on the assembly costs of the electronic unit of the invention. In particular, a positive connection between the heat sink and the slot section is formed thereby, as a result of which the electronic components mounted in the insertion slots are covered by the heat sinks and thus protected. It is provided hereby that the heat sink is clipped with its counter-structure onto the coupling structure. It is also preferred here if the coupling structures are formed on the end faces of the slot section.

Opposite heat sinks can be connected to one another by a fastener, which can be, for example, screws, rivets, clamps, positive-locking and spring-biased coupling elements, and/or adhesive bonds. As a result, the opposite heat sinks can be securely connected to one another, whereby the electronic components mounted in the insertion slots are enclosed by the heat sinks and protected from external influences. In this regard, it has also been shown to be beneficial if a feed-through, through which the fastener is passed, is formed in the slot section transverse to the direction of insertion. Thus, during mounting, for example, the screw serving as a fastener can be passed through the heat sink and through the feed-through formed in the slot section and screwed in. If the electronic components mounted in the insertion slots also have feed-throughs, they can be connected particularly simply to the heat sinks to form a single unit.

In order to protect the other electronic components that are mounted on the circuit board, it has also proven to be advantageous if a potting mask is provided by which at least one potting area, which can be encapsulated by a potting compound, and at least one potting-compound-free area are defined on the circuit board. It is achieved by using the potting compound, which is based, for example, on epoxy, silicone, polyurethane, or polyester, that the electronic components located on the circuit board are protected from mechanical damage and contamination from the working environment of the hand-held power tool, especially from electrically conductive metal dust, wherein it is lastly ensured by the potting mask that only the areas that are not blocked out by the potting mask are covered by the potting compound. The potting mask has webs with different heights, which are designed such that only the webs of the potting mask lie on the circuit board, said webs by which the potting-compound-free areas are defined. These include in particular contact points for the connection of cables. When the circuit board is encapsulated, the potting compound flows under the remaining webs and sections, as a result of which the potting area is defined. The mounting frame in this case can have a raised edge, by which the filling level of the potting compound is limited. In the context of the invention, it is also provided in particular that multiple potting areas are defined.

The potting mask can be assigned reference geometries which define the orientation of the potting mask relative to the circuit board. As a result, the potting mask must be oriented to the circuit board during assembly only such that the reference geometries can engage in the corresponding structures, for example, openings, which are formed on the circuit board. Furthermore, it has also proven useful in this context if the potting mask has support elements for supporting the potting mask on the circuit board and/or on the mounting frame, as a result of which the encapsulation of the circuit board with the potting compound is facilitated.

In order to facilitate the connection between the potting mask and the circuit board, it has also proven to be advantageous if anchoring lugs are formed on the reference geometries and/or on the support elements. The anchoring lugs are embedded in these during the encapsulation of the circuit board with the potting compound, as a result of which the potting mask is securely connected to the circuit board.

In addition, it has also proven useful if the mounting frame has a receptacle whose receiving opening is oriented perpendicular to the direction of insertion of the at least one insertion slot. In this receptacle, an accommodation space is provided, in which, for example, a capacitor or other relatively large electronic components can be inserted and which is lastly axially spaced from the circuit board, as a result of which space is created on the circuit board in order to be able to attach other electronic components thereon.

The cooling of the electronic unit can be improved if the mounting frame has a T-shaped cross section and if the at least one slot section is arranged centrally to the accommodation space. Due to the resulting symmetrical structure of the electronic unit, the waste heat from the cooling air flowing around the heat sink is removed particularly effectively.

It has also been shown to be beneficial if a switch holder is provided with a switch guide on which a switch can be placed. The switch holder can be formed in particular on the potting mask. As a result, during assembly of the electronic unit only the switch, which serves as an on/off switch, for example, must be inserted in the switch guide of the switch holder and secured there so that its position on the electronic unit is fixed. This results in the advantage during assembly that the electronic unit can be installed as a unit together with the switch. In this context, it has also proven effective if a switch receptacle having a through-hole is formed on the mounting frame for receiving a rotary switch, with which the drive characteristics of the hand-held power tool can be changed. This also has a positive effect on the assembly effort, because thus the complete electronic unit can be completely pre-assembled, therefore, with the on/off switch and with the rotary switch, and inserted into the machine tool. It has also proven to be particularly advantageous if a coupling section, which is suitable to be coupled to a machine housing of a hand-held power tool, is formed on the mounting frame on the outer perimeter. The arrangement of the electronic unit within the hand-held power tool is fixed hereby, so that it can be inserted in the machine housing of the hand-held power tool during assembly.

In the context of the invention, it is also provided in this case in particular that the form of the insertion slots is adapted to the shape of the electronic components which are intended to be mounted in the insertion slots; as a result, a suitable orientation of the electronic components mounted in the insertion slots relative to the circuit board located in the accommodation space is achieved. In particular, the heights of the insertion slots are adapted to the particular electronic components.

It has also proven useful if self-tapping terminal contacts are provided on the circuit board for connecting non-terminated connecting wires of a drive of a hand-held power tool. Thus, the connecting wires of the electric drive of a hand-held power tool can be easily inserted by means of a "push-in" contacting into the self-tapping terminal contacts. In this case, the insulation is removed locally and the stranded wire clamped in the terminal contact and simultaneously contacted electrically. This represents a simple way of contacting, in which the use of pre-lengthened cables and special cable connections can be dispensed with.

The invention also comprises in particular a hand-held power tool having an electronic unit of the invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
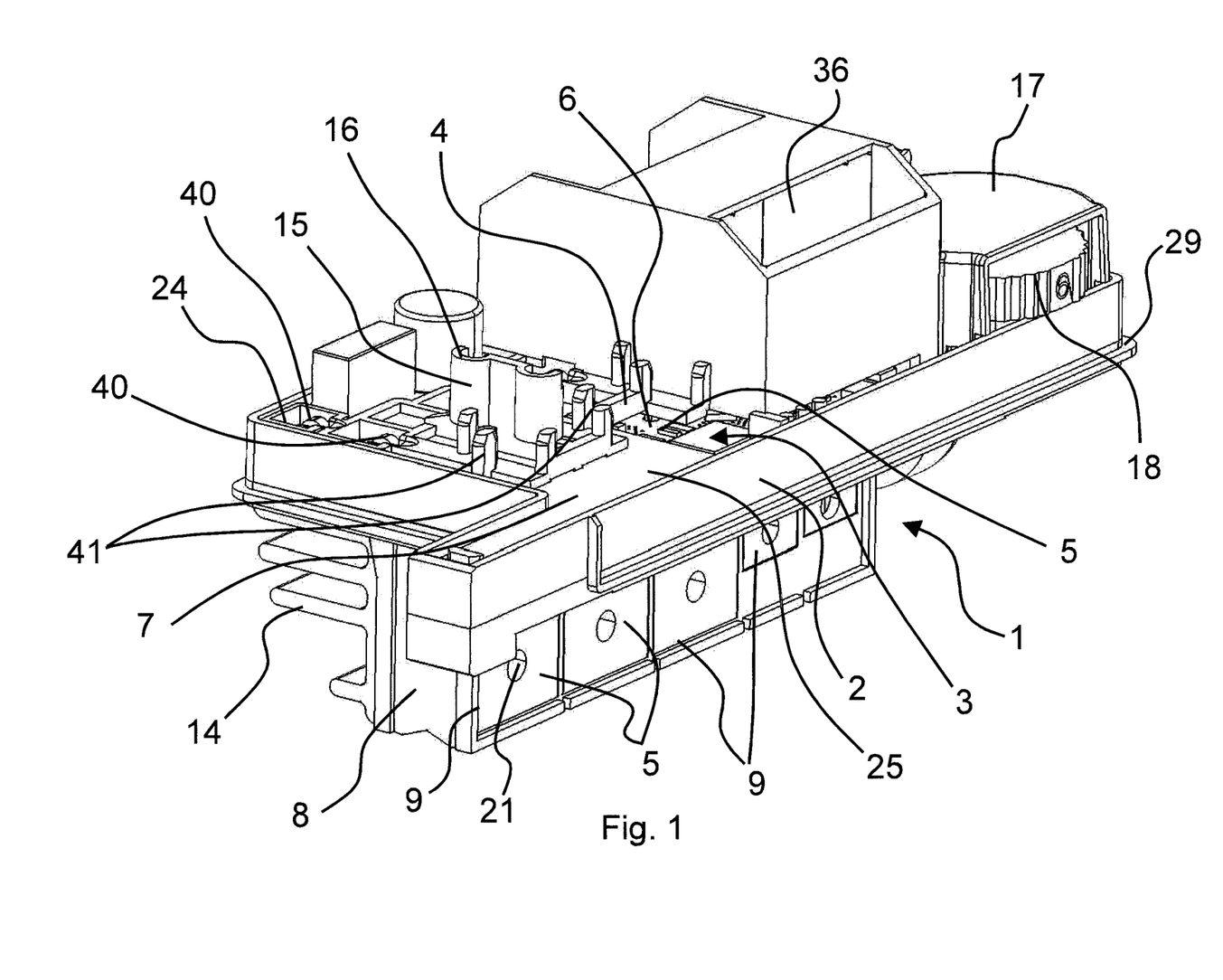
FIG. 1 shows a perspective view of an electronic unit.

FIG. 1 shows a perspective view of an electronic unit 1 for a hand-held power tool. Electronic unit 1 in this case has a mounting frame 2, which comprises an accommodation space 3, and a potting mask 4. A circuit board 6 bearing a plurality of electronic components 5 is inserted in accommodation space 3, wherein a portion of electronic components 5 are encapsulated on circuit board 6 by a potting compound 7 and are thus protected against mechanical damage and contamination from the working environment of the hand-held power tool, especially against electrically conductive metal dust. A slot section 8 with a plurality of insertion slots 9, which are oriented perpendicular to circuit board 6, is formed on mounting frame 2. Further electronic components 5 are inserted in insertion slots 9 along a direction of insertion 10. In the first instance shown, insertion slots 9 are arranged in a first row 11 and in a second row 12, which are separated from one another by a separator 13, which is evident in particular from FIG. 2. Heat sinks 14, which are in thermal contact with electronic components 5 mounted in insertion slots 9, are attached on opposite end faces of slot section 8. Only one of heat sinks 14 is shown in FIG. 1, whereas the illustration of the other heat sink 14 has been omitted for reasons of clarity in order to be able to depict electronic components 5 mounted in insertion slots 9. A switch holder 15, which has a switch guide 16 on which a switch 33 can be placed during assembly, is formed on potting mask 4. A switch receptacle 17, in which a rotary switch 18 is mounted, with which it is possible for the user to change the motor characteristic of the hand-held power tool, can be gathered further from FIG. 1. In addition, a receptacle 36, in which, for example, a capacitor can be inserted, is formed on potting mask 4. Self-tapping terminal contacts 40 can also be seen in which stranded wires of a drive of a hand-held power tool can be inserted, as will be described in greater detail below. These stranded wires can then be secured in cable guides 41, which are formed on potting mask 4.

Figure 2:
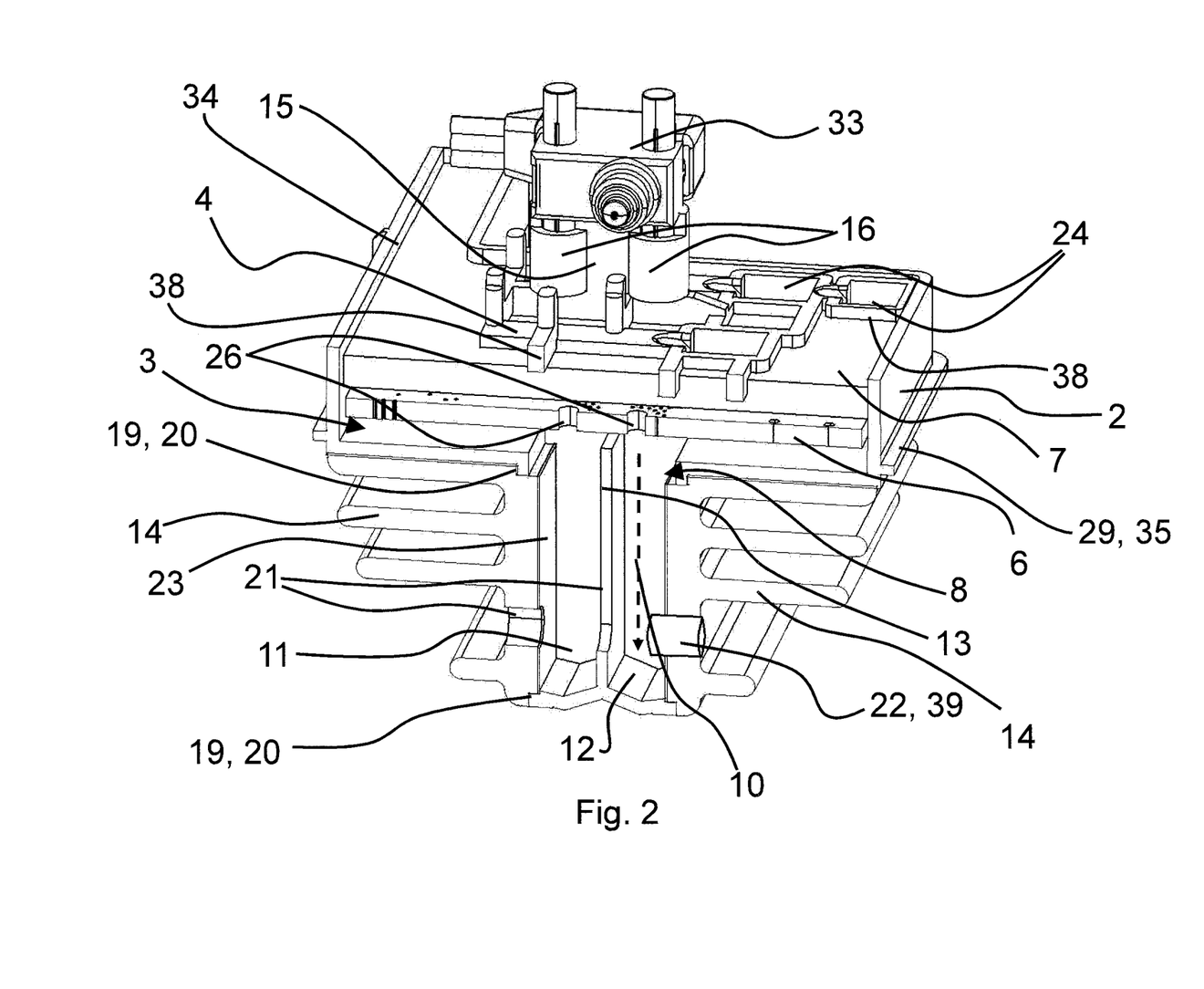
FIG. 2 shows a perspective sectional view through the electronic unit.

FIG. 2 shows a perspective sectional view through electronic unit 1. Circuit board 6 which is located in accommodation space 3 of mounting frame 2 and in which potting mask 4 is inserted can be seen in particular here. For the sake of greater clarity, the representation of electronic components 5 is dispensed with. In particular, it can be gathered from the sectional view of FIG. 2 that mounting frame 2 has a T-shaped cross section and that slot section 8 is arranged centrally to accommodation space 3. In addition, the arrangement of heat sinks 14, which are arranged on opposite end faces of slot section 8, also becomes clear once again from FIG. 2. In order to simplify the mounting of heat sink 14 on mounting frame 2, coupling structures 19, which are in engagement with counter-structures 20 formed on heat sink 14, are formed on slot section 8 in the region of the end faces. In heat sinks 14 and in separator 13, which separates first row 11 of insertion slots 9 from second row 12, feed-throughs 21 are formed, which receive a screw connection 39 serving as a fastener 22, in order to enclose electronic components 5, mounted in insertion slots 9, by heat sink 14, wherein electronic components 5 can also have feed-throughs 21. In this case, a heat-conducting pad 23 is mounted between heat sink 14 and electronic components 5, in order to improve the heat transfer to heat sink 14. Potting mask 4 has different areas that differ in their height. In areas of webs 38, in which potting mask 4 lies directly on circuit board 6, potting-mask-free areas 24 are defined, which remain free when electronic components 5 are encapsulated by potting compound 7. In contrast, in the areas in which webs 38 of potting mask 4 do not rest directly on circuit board 6, potting areas 25 are defined, which are filled with potting compound 7 when it is poured in order to protect electronic components 5 located therein against mechanical damage and contamination from the working environment of the hand-held power tool, especially against electrically conductive metal dust. In addition, holes 26 can be seen in the sectional view in circuit board 6; the connection pins of electronic components 5 located in insertion slots 9 are passed through these through circuit board 6 to the top side of circuit board 6 so as to solder them there. In this case, insertion slots 9 have, in particular in the bottom region, a shape adapted to the form of electronic components 5 located therein, as a result of which the mounting of these electronic components 5 is facilitated.

Figure 3:
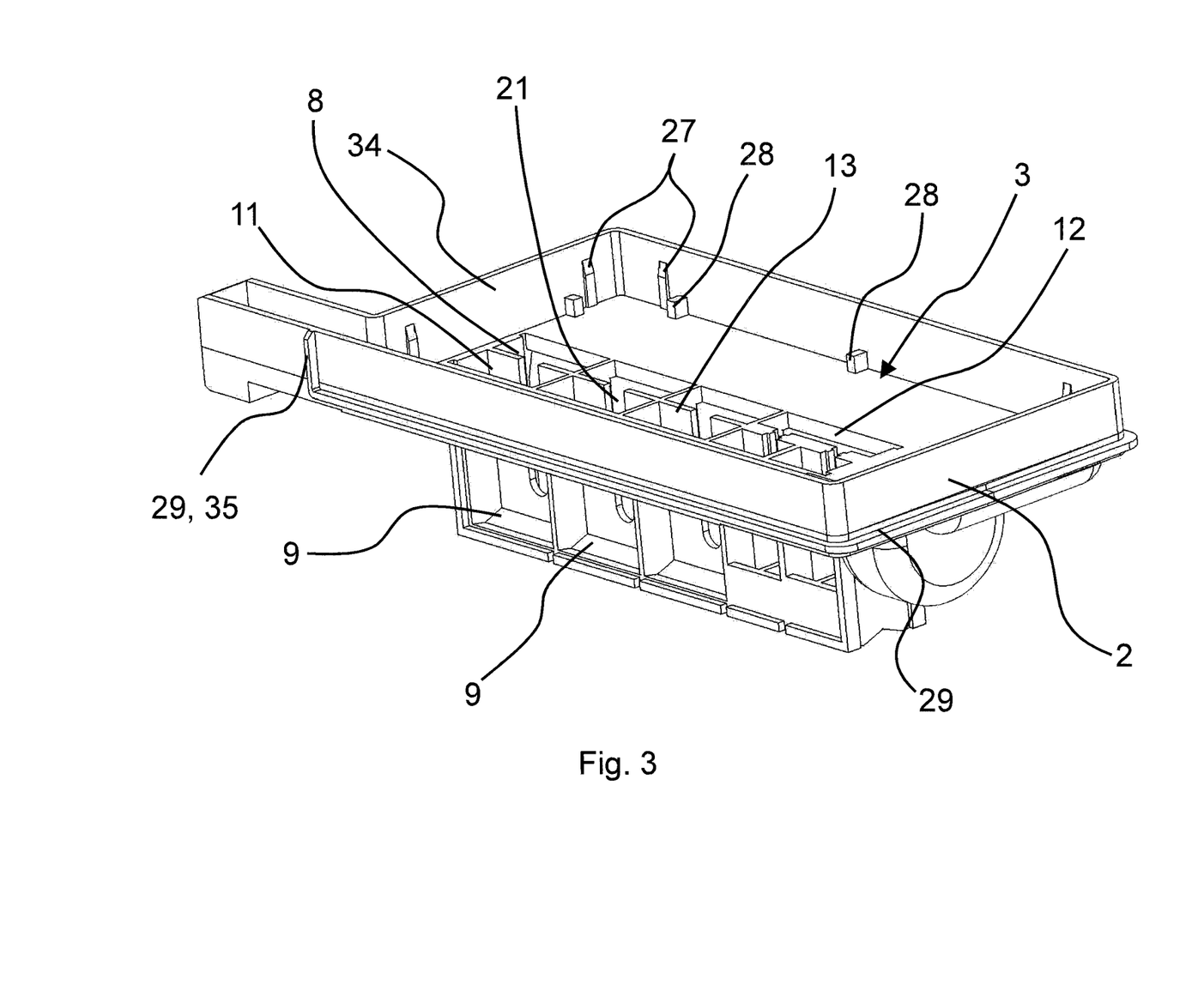
FIG. 3 shows a perspective view of a mounting frame.

FIG. 3 shows a perspective view of mounting frame 2. Here, in particular insertion bevels 27 can be seen, which facilitate the insertion of circuit board 6 in accommodation space 3. Furthermore, supports 28, on which circuit board 6 rests in the mounted state and which define the axial position of circuit board 6 in accommodation space 3, are formed in accommodation space 3. These are dimensioned such that when circuit board 6 has been placed, there still is a sufficiently high edge 34 for pouring potting compound 7 on circuit board 6. Coupling sections 29 are formed on the outer perimeter on mounting frame 2; these make it possible to couple electronic unit 1 with a machine housing of a hand-held power tool. In this connection, coupling sections 29 are formed as an at least partially surrounding flange 35.

Figure 4:
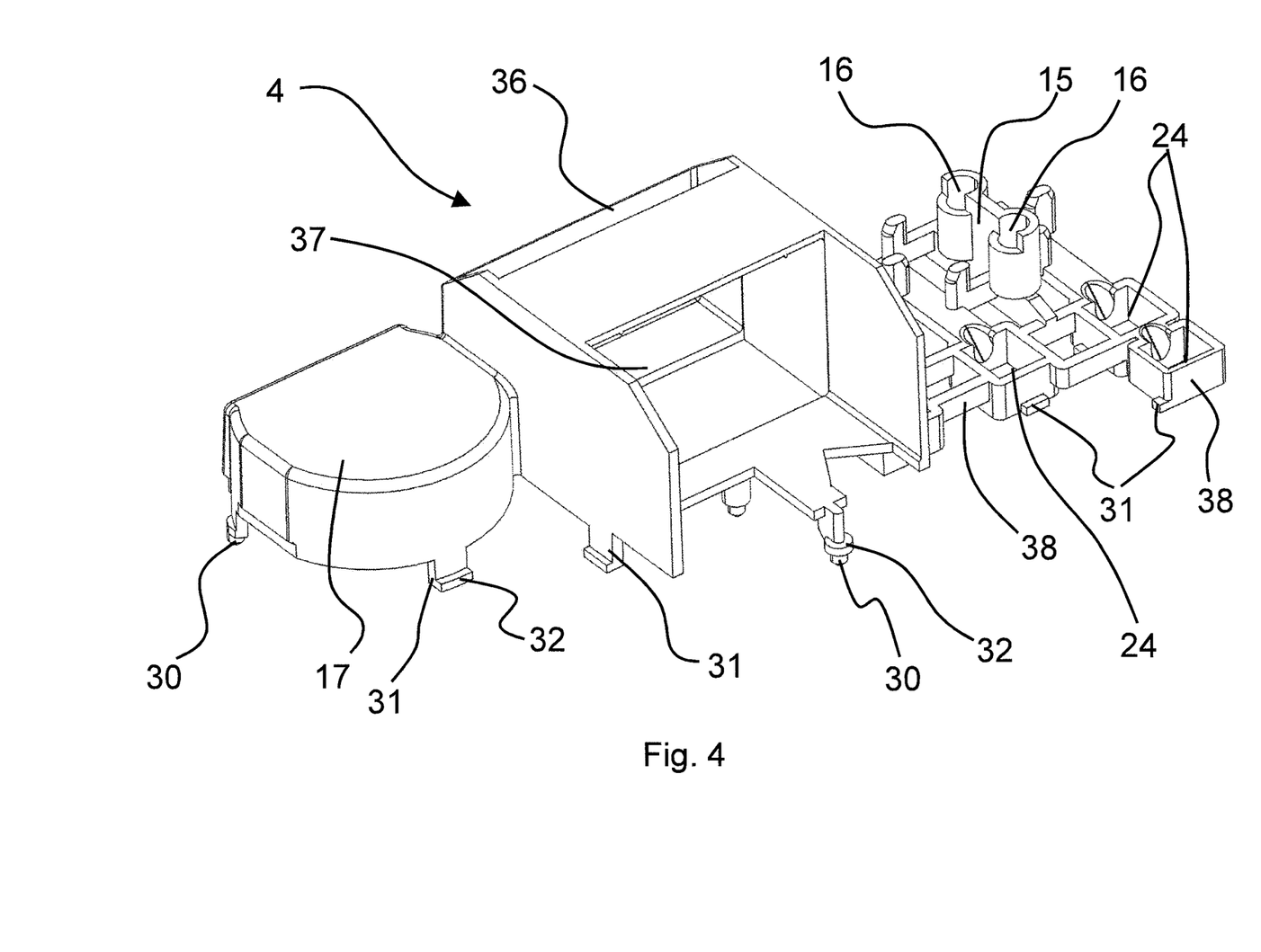
FIG. 4 shows a perspective view of a potting mask of the electronic unit.

FIG. 4 shows potting mask 4 of electronic unit 1 of the invention likewise in a perspective view. In addition to the different height of webs 38 of potting mask 4, by which the at least one potting-compound-free area 24 and potting area 25 are formed, in particular switch receptacle 17 for rotary switch 18 and switch holder 15 with switch guide 16 can be seen in FIG. 4. On the bottom side, therefore, on the side facing circuit board 6, of potting mask 4, reference geometries 30 are formed, which define the orientation of potting mask 4 relative to circuit board 6. In addition, potting mask 4 has support elements 31 which serve to support potting mask 4 on circuit board 6. In order to facilitate the encapsulation of potting mask 4 in potting compound 7, anchoring lugs 32 are formed in the illustrated initial instance on reference geometries 30 and on support elements 31; when potting compound 7 is poured on circuit board 6, they are embedded in it, so that ultimately the surface of the contact points of potting mask 4, which are embedded by potting compound 7, is increased, which results in an improved connection of potting mask 4 with potting compound 7. Lastly, FIG. 4 also shows receptacle 36, which serves to receive a capacitor. Receiving opening 37 of receptacle 36 is oriented here perpendicular to direction of insertion 10 of insertion slots 9.

The assembly of electronic unit 1 of the invention will be described once again in greater detail below. First, a portion of electronic components 5 are inserted into insertion slots 9 of slot section 8 formed on mounting frame 2. These electronic components 5 are protected in insertion slots 9 by heat sink 14 and connected to form a unit. In addition, electronic components 5 mounted in insertion slots 9 can be fixed by fastener 22 passed through heat sinks 14. Then, prefabricated circuit board 6 is inserted into accommodation space 3, wherein the terminal contacts of electronic components 5, mounted in insertion slots 9, pass through holes 26, which are formed in circuit board 6, so that the terminal contacts can be soldered on circuit board 6. When circuit board 6 is placed in accommodation space 3, the positioning of circuit board 6 relative to mounting frame 2 is facilitated by means of insertion bevels 27 and supports 28, which are formed on mounting frame 2. Next, electronic components 5 are soldered to circuit board 6. In a further step, potting mask 4 is placed on circuit board 6 located in accommodation space 3. In order to facilitate here as well the positioning of potting mask 4 relative to circuit board 6, reference geometries 30 are formed on potting mask 4; these engage in corresponding openings formed on the surface of circuit board 6. In addition, potting mask 4 has support members 31, with which potting mask 4 is supported on circuit board 6. In this case, potting-compound-free areas 24 and potting areas 25 are defined by potting mask 4. If now a potting compound 7, for example, epoxy resin, is poured onto circuit board 6, it flows, limited by edge 34 of mounting frame 2, into potting areas 25, which are defined by potting mask 4, whereas potting compound 7 does not flow into potting-compound-free areas 24 because potting mask 4 lies on circuit board 6 there and seals against it. The seal between circuit board 6 and potting mask 4 can be adapted in particular by the application of sealing materials and sealing aids to the employed potting compound 7. These substances can in particular be paste-like and are intended to prevent penetration, for example, creeping, of potting compound 7 into the potting-compound-free areas 24. In this case, potting compound 7 of course flows into the intermediate space which is formed between edge 34 and circuit board 6, and thus around circuit board 6 and into slot section 8, in which insertion slots 9 are formed. As a result, a unit is created which is self-encapsulated by potting compound 7 but also by heat sink 14, and in which only potting-compound-free areas 24 of potting mask 4 on circuit board 6 are accessible. Switch 33 can now be placed on switch holder 15 and secured there, for example, by a latching connection. After the remaining electronic components 5 are connected, electronic unit 1 can be installed in a hand-held power tool, for example, in an angle grinder. Here, the following assembly steps have proven to be beneficial. First, in a first step, electronic unit 1 is inserted into the hand-held power tool, wherein the position of electronic unit 1 in the hand-held power tool can be determined by coupling section 29, which is formed on the outer perimeter on mounting frame 2. For this purpose, a corresponding structure, which interacts with coupling section 29, which is formed as a circumferential flange in the illustrated exemplary embodiment 35, is formed in the hand-held power tool. In a second step, the non-terminated stranded wires of the drive of the hand-held power tool are then connected to terminal contacts 40 situated on board 6 in potting-compound-free areas 24. These are designed to be self-tapping, so that when stranded wires are inserted in the terminal contacts 40, the insulation of the non-terminated stranded wires is locally removed, and these are clamped simultaneously and thus electrically contacted. The stranded wires are then inserted in cable guides 41, which are formed on potting mask 4, and thereby additionally secured.

The invention being thus described, it will be obvious that the same may be varied in many ways. Such variations are not to be regarded as a departure from the spirit and scope of the invention, and all such modifications as would be obvious to one skilled in the art are to be included within the scope of the following claims

What is claimed is:

1. An electronic unit for a hand-held power tool, the electronic unit comprising:
a mounting frame having an accommodation space into which a circuit board carrying a plurality of electronic components is inserted and a slot section that protrudes from a bottom surface of the mounting frame; and
at least one heat sink for heat dissipation of waste heat arising at the electronic components;
wherein the slot section has at least one insertion slot oriented substantially perpendicular to the circuit board, for mounting an electronic component along a direction of insertion, and
wherein the at least one heat sink is associated with the slot section.

2. The electronic unit according to claim 1, wherein a plurality of the at least one heat sink are provided, which are disposed on opposite end faces of the slot section.

3. An electronic unit for a hand-held power tool, the electronic unit comprising:
a mounting frame having an accommodation space into which a circuit board carrying a plurality of electronic components is inserted;
at least one heat sink for heat dissipation of waste heat arising at the electronic components; and
a slot section with at least one insertion slot oriented substantially perpendicular to the circuit board, for mounting an electronic component along a direction of insertion, is formed on the mounting frame,
wherein the at least one heat sink is associated with the slot section, and
wherein a plurality of the at least one insertion slot are provided, and wherein the plurality of the at least one insertion slot are arranged in a first row and in a second row, which are spaced from one another by a separator.

4. The electronic unit according to claim 1, wherein coupling structures, which interact with counter-structures formed on the at least one heat sink, are formed on the slot section.

5. The electronic unit according to claim 2, wherein the plurality of the at least one heat sink disposed on the opposite end faces of the slot section are connected to one another by a fastener, which is selected from a group comprising screws, rivets, clamps, positive-locking and spring-biased coupling elements, or adhesive bonds.

6. The electronic unit according to claim 5, wherein a feed-through, through which the fastener is passed, is formed in the slot section substantially perpendicular to the direction of insertion.

7. The electronic unit according to claim 1, wherein a potting mask is provided, by which on the circuit board at least one potting area, which is encapsulated by a potting compound, and at least one potting-compound-free area are defined.

8. The electronic unit according to claim 7, wherein the potting mask is assigned reference geometries that define the orientation of the potting mask relative to the circuit board.

9. The electronic unit according to claim 8, wherein the potting mask has support elements for supporting the potting mask on the circuit board and/or on the mounting frame.

10. The electronic unit according to claim 9, wherein anchoring lugs are formed on the reference geometries and/or on the support elements.

11. The electronic unit according to claim 7, wherein the potting mask has a receptacle having a receiving opening oriented substantially perpendicular to a direction of insertion of the at least one insertion slot.

12. The electronic unit according to claim 1, wherein the mounting frame has a T-shaped cross section, and wherein the slot section is arranged centrally to the accommodation space.

13. The electronic unit according to claim 1, wherein a switch holder is provided with a switch guide on which a switch is placed.

14. An electronic unit for a hand-held power tool, the electronic unit comprising:
- a mounting frame having an accommodation space into which a circuit board carrying a plurality of electronic components is inserted;
- at least one heat sink for heat dissipation of waste heat arising at the electronic components; and
- a slot section with at least one insertion slot oriented substantially perpendicular to the circuit board, for mounting an electronic component along a direction of insertion, is formed on the mounting frame,
- wherein the at least one heat sink is associated with the slot section, and
- wherein a switch receptacle having a through-hole is formed on the mounting frame for receiving a rotary switch which changes the drive characteristics of the hand-held power tool.

15. The electronic unit according to claim 1, wherein a coupling section, which is suitable to be coupled with corresponding coupling counter sections of a machine housing of the hand-held power tool, is formed on the mounting frame on an outer perimeter.

16. The electronic unit according to claim 1, wherein self tapping terminal contacts are provided on the circuit board for connecting non-terminated connecting wires of a drive of the hand-held power tool.

17. The electronic unit according to claim 1, wherein the mounting frame and the slot section are monolithic.

* * * * *